(12) United States Patent
Li et al.

(10) Patent No.: US 8,131,048 B2
(45) Date of Patent: Mar. 6, 2012

(54) METHOD AND APPARATUS FOR CORRECTING DISTORTION DURING MAGNETIC RESONANCE IMAGING

(75) Inventors: Guo Bin Li, Shenzhen (CN); Bi Da Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 577 days.

(21) Appl. No.: 12/344,922

(22) Filed: Dec. 29, 2008

(65) Prior Publication Data
US 2009/0169084 A1    Jul. 2, 2009

(30) Foreign Application Priority Data
Dec. 29, 2007  (CN) .......................... 2007 1 0301667

(51) Int. Cl.
*G06K 9/00* (2006.01)
(52) U.S. Cl. ......... 382/131; 382/128; 324/307; 600/407
(58) Field of Classification Search .......... 382/128–134; 600/300, 407, 410, 425; 324/300, 307, 310, 324/312, 313
See application file for complete search history.

(56) References Cited

U.S. PATENT DOCUMENTS 6,476,607 B1 *  11/2002  Dannels et al. ............... 324/309
2008/0157767 A1   7/2008  Bammer et al.

* cited by examiner

*Primary Examiner* — David Mis
(74) *Attorney, Agent, or Firm* — Schiff Hardin LLP

(57) ABSTRACT

In a method and apparatus for correcting distortion during magnetic resonance imaging k space data in a number of readout encoding directions, sampling points on the phase encoding lines are primarily in low frequency regions of k space and the number of such sampling points is less than that of all sampling points. A view angle tilting compensation gradient is superimposed on the axis of a layer selection gradient. The k space data acquired from the number of directions are then combined.

13 Claims, 5 Drawing Sheets

The K space data are acquired in a plurality of data-reading directions, the sample points on the phase coding lines are concentrated in the low frequency region and their number is less than that of full sampling points, and a view angle tilting compensation gradient is superimposed on the axis of a layer selection gradient. — S101

The K space data acquired in the plurality of directions are combined and converted into a final image. — S102

FIG 1

The K space data are acquired in a plurality of data-reading directions, the sample points on the phase coding lines are concentrated in the low frequency region and their number is less than that of full sampling points, and a view angle tilting compensation gradient is superimposed on the axis of a layer selection gradient. —S101

The K space data acquired in the plurality of directions are combined and converted into a final image. —S102

FIG 2

Acquiring the K space data in a blade. —S201

Superimposing a gradient for correcting geometric distortion on the axis of a slice selection gradient. —S202

After completing the data acquisition in a blade, rotating the blade in K space and acquiring data in K space until data of all the blades are collected. —S203

Combining the data acquired from all the blades, and generating a final image. —S204

FIG 12
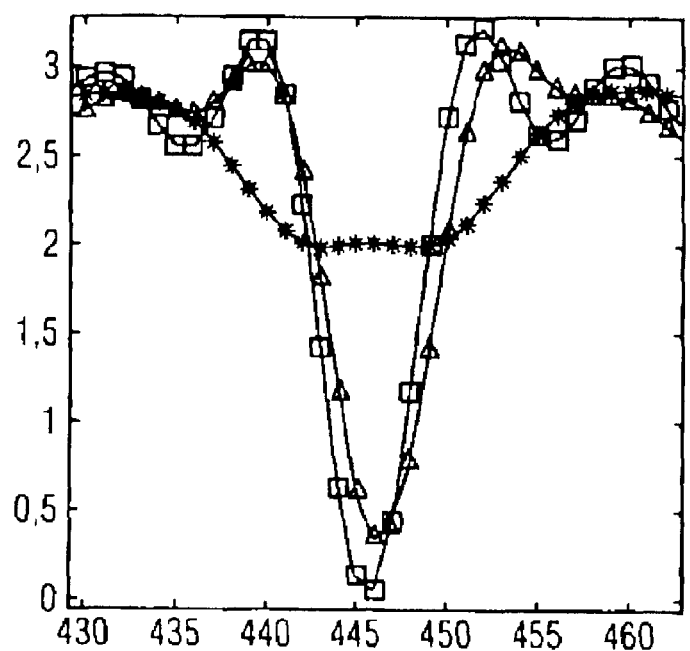
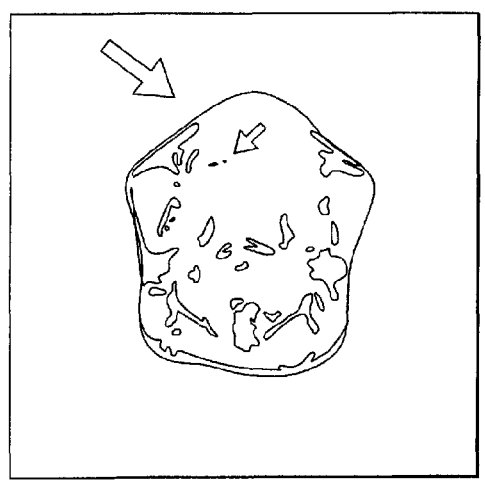
FIG 13
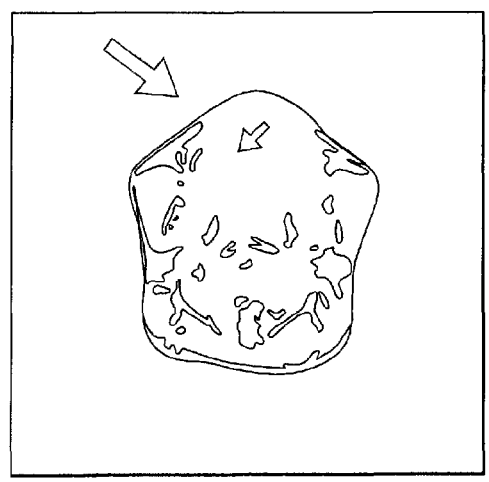
FIG 14

METHOD AND APPARATUS FOR CORRECTING DISTORTION DURING MAGNETIC RESONANCE IMAGING

BACKGROUND OF THE INVENTION

1. Field of the Invention

The present invention relates to magnetic resonance imaging (MRI) technology and, particularly to a method and apparatus for correcting distortion during MRI.

2. Description of the Prior Art

The influence of geometric distortion caused by non-uniform magnetic field on MRI is relatively large. Generally, the factors such as chemical shift, susceptibility difference or metal devices implanted in a body will lead to a non-uniform magnetic field.

Currently, a view angle tilting (VAT) method has been proposed for solving the geometric distortion problem during MRI images. The basic principle of the VAT method is to superimpose a compensation gradient on the axis of a slice-selection gradient at the same time when a readout gradient is applied, so that the view angle will be slightly tilted. This method can correct all the non-uniformity caused geometric distortions and density variations.

Although the implementation of the VAT method can correct the geometric distortion effectively, the final image by the VAT method will be blurred, and when such blurring is relatively severe, or in case that the requirement to the image definition is relatively high, then such MRI images cannot be used as an evidence for diagnosis.

SUMMARY OF THE INVENTION

An object of the present invention is to provide a method for correcting distortion during MRI, which is capable of reducing the degree of image blurring and reducing motion artifacts while the geometric distortions are corrected.

Another object of the present invention is to provide an apparatus corresponding to the above mentioned method for correcting distortion during MRI.

The above object is achieved in accordance with present invention by a method for correcting distortion during MRI, that includes the steps of acquiring the k space data in a plurality of readout (RO) encoding directions, wherein sampling points on a phase encoding line are concentrated in a low frequency region and their number is less than that of full sampling points, superimposing a view angle tilting compensation gradient on the axis of a slice-selection gradient, and combining the k space data acquired in the multiple of directions and converting the combined data into a final image.

The method can further includes sampling the whole phase encoding lines to obtain full resolution in the phase encoding direction when acquiring the k space data in each of the readout directions.

The acquisition of the k space data in each of the readout encoding directions can be done by acquiring the k space data in the number of readout directions in a parallel acquisition mode or in a partial Fourier imaging mode.

The acquisition of the k space data in the number of readout encoding directions can be done by acquiring the k space data by using a turbo spin echo sequence or a spin echo sequence.

The superimposition of the view angle tilting compensation gradient on the axis of the slice-selection gradient can be done by superimposing the compensation gradient on the axis of the slice-selection gradient at the same time as a readout gradient is applied.

The number of the readout encoding directions is N, in which N is a positive integer; and a rotation incremental angle in all the readout directions in k space is $\pi/N$.

The ratio of the number of sampling points on the phase encoding line to the number of the full sampling points can be set to arbitrary value from above 0 to 1.

The above object is also achieved in accordance with the present invention by an apparatus for correcting distortion during magnetic resonance imaging, having an acquisition unit, for acquiring the k space data in a number of readout encoding directions, and a controller that operates the acquisition unit so that the sampling points on a phase encoding line are concentrated in a low frequency region and their number is less than that of full sampling points, and that superimposes a view angle tilting compensation gradient on the axis of a slice-selection gradient; and a combining unit that combines the k space data acquired in the number of directions and that converts the combined data into a final image.

When the acquisition unit acquires the k space data in each of the phase encoding directions, the phase encoding lines are acquired to reach full resolution in the phase encoding direction.

The combining unit can acquire the k space data in each of the readout encoding directions in a parallel acquisition mode or in a partial Fourier mode.

The acquisition unit can acquire the k space data in a plurality of readout directions using a turbo spin echo sequence or a spin echo sequence.

The controller can superimpose the compensation gradient on the axis of the slice-selection gradient at the same time as it causes a readout gradient to be applied.

The acquisition unit can acquire the k space data in N readout directions, in which N is a positive integer. The rotation incremental angle in all of the readout directions in k space is $\pi/N$.

It can be seen from above the technical solution that, in the present invention, the k space data are acquired in a number of readout encoding directions, wherein sampling points on a phase encoding line are concentrated in a low frequency region and their number is less than that of full sampling points, and a view angle tilting compensation gradient is superimposed on the axis of slice-selection gradient; the k space data acquired in the plurality of directions are combined and converted into a final image. In this technical solution, due to the fact that the superimposition of the view angle tilting compensation gradient on the axis of the slice-selection gradient can effectively calibrate geometric distortions, for each readout direction, only the data in the low frequency region at the center of the k space are acquired. In the phase encoding directions the data of full resolution are acquired, then a number of blades of data are acquired in Cartesian mode by combining with the acquisition technology in a plurality of readout encoding directions, and finally a plurality of blades of data are combined to fill in the entire k space. Due to the fact that the resolution of the data obtained in the read-out direction is lower than the full resolution, the blurring caused by the view angle tilting is also reduced, so that the degree of blurring in the final image is alleviated. In each of the readout directions only a low resolution is obtained, while by rotating the encoding direction a high resolution is obtained in all the directions. Also, by rotating the encoding direction the sensitivity of MRI to motions can be reduced. In summary, by using the solution of the present invention not only can calibration of the geometric distortions be performed during magnetic resonance imaging, but the images' degree of blurring and the motion artifacts can also be reduced.

BRIEF DESCRIPTION OF THE DRAWINGS

FIG. 1 is a flowchart of the method for correcting distortion during MRI in accordance with the present invention.

FIG. 2 is a flowchart of a method for correcting distortion during MRI according to a first embodiment of the present invention.

FIG. 12 is a comparative schematic diagram of the intensity curves of the pixels of the dashed line areas in FIGS. 8 to 10.

FIG. 13 is a MR image with geometric distortion caused by metal false teeth in a patient's mouth.

FIG. 14 is a calibrated MR image obtained using the solution of the present invention.

DESCRIPTION OF THE PREFERRED EMBODIMENTS

In order to make the object, technical solution and advantage of the present invention more apparent, the present invention will be further described in detail in conjunction with accompanying drawings and embodiments. It should be understood that the embodiments explained here are merely to explain the present invention; they are not to define the present invention.

The inventive method and apparatus are based on the insight that, during the VAT imaging, there was a tilted view angle θ in the readout direction, therefore during the VAT imaging, a normal rectangular pixel would distort into a diamond shape, thus leading to image blurring, while there was no distortion in the PE direction. To address this problem; in the method and apparatus according to the invention, during the implementation of the VAT solution, the thickness of pixel in the RO direction is increased and at the same time the thickness of pixel in the slice-selection direction is maintained, thereby reducing the degree of blurring in an image, and obtaining a high resolution in all directions by rotating the encoding direction.

FIG. 1 is a flowchart of the basic content of a method for correcting distortion during MRI according to the present invention. As shown in FIG. 1, at step S101, the k space data are acquired in a plurality of data-reading directions, wherein sampling points on a phase encoding line are concentrated in a low frequency region and their number is less than that of full sampling points, and when acquiring the data, a view angle tilting compensation gradient is superimposed on the axis of a layer selection gradient; at step S102, the K space data acquired in the plurality of directions are combined and converted into a final image.

The present invention will be described in detail below by way of several particular embodiments.

FIG. 2 is a flowchart of the method for correcting distortion during MRI according to a first embodiment of the present invention. As shown in FIG. 2, during MRI, distortion calibration mainly comprises the following steps:

At step S201, the k space data are acquired in a blade.

Figure 3:
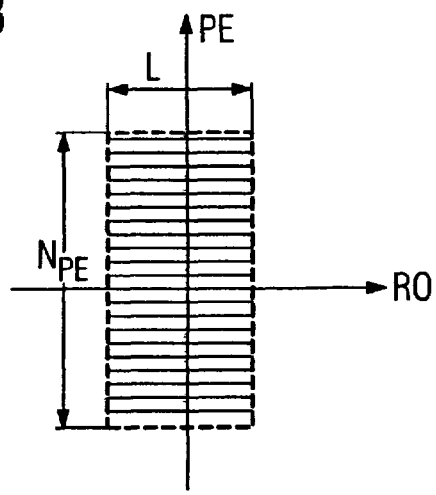
FIG. 3 is a schematic diagram of the acquisition of the k space data in a blade in the first embodiment.

K space is also called frequency space; in this space the vertical and horizontal coordinates represent frequency changes in a phase encoding direction and in a frequency encoding direction respectively. FIG. 3 is a schematic diagram of the acquisition of the k space data in a blade of the embodiment. As shown in FIG. 3, when acquiring the k space data in a blade, a blade comprises $N_{PE}$ parallel linear tracks. Here, $N_{PE}$ is the number of PE lines in a finally reconstructed image. On each phase encoding line, at least L points in k space are acquired. The acquisition of a blade can be carried out using a spin echo (SE) sequence or a turbo spin echo (TSE) sequence. It can be seen that in each blade, the resolution in the RO direction is low, while the acquisition of one blade in the PE direction covers the entire scope of k space; therefore a high resolution is provided in the PE direction. In this embodiment, the ratio of the number of full sampling points in the phase encoding line to L is 8.

At step S202, a gradient for correcting geometric distortion is superimposed on the axis of slice-selection gradient.

Specifically, the method is as follows: a compensation gradient is superimposed while applying the readout gradient, which compensation gradient is applied on the axis of slice-selection gradient. Preferably, the compensation gradient has the same value as the slice-selection gradient, so that the view angle will be slightly tilted. This method can correct all the non-uniformity caused by geometric deviation and density variation of the image caused thereby.

At step S203, after the data acquisition in a blade is completed, the blade is rotated in k space with an angle increase of π/N, wherein N is the number of the blades, and the k space data are acquired in the same mode until the data of all N blades are acquired.

Figure 4:
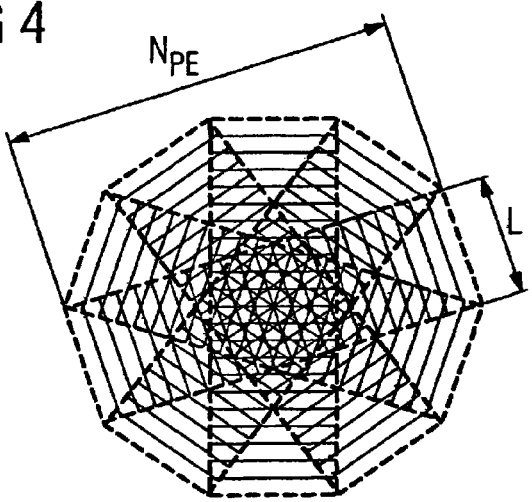
FIG. 4 is a schematic diagram of the acquisition of the k space data in a plurality of blades in the first embodiment.

FIG. 4 is a schematic diagram of the acquisition of the k space data in a number of blades in the embodiment. As shown in FIG. 4, in this embodiment, the number of the blades is 5, therefore, the blade needs to be rotated 5 times, and that is, the k space data are acquired using the 5 blades.

At step S204, the data acquired in all blades are combined to construct a final image.

If the combination in k space is adopted, the data of all the blades are converted into k space, these data are re-gridded into a Cartesian coordinates system to form the complete k space, then, a final image is obtained by inverse Fourier transform.

It should be noted that, when acquiring the data, partial Fourier transform imaging technology or parallel imaging technology can be incorporated at the same time during the acquisition of each blade, thereby reducing the time for acquiring a number of blades. In this way, the time a complete measurement will be shortened to is within a relatively ideal range. For a T1 weighed image the time is generally 2 to 5 minutes.

The present invention also proposes an apparatus corresponding to the above-described method for correcting distortion during MRI.

Figure 5:
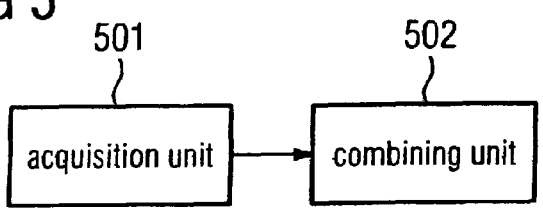
FIG. 5 is a structural diagram of an apparatus for correcting distortion during MRI in a second embodiment of the present invention.

FIG. 5 is a structural diagram of the apparatus for correcting distortion during MRI of a second embodiment of the present invention. As shown in FIG. 5, the apparatus has an acquisition unit 501 and a combining unit 502. The acquisition unit 501 acquires the k space data in a plurality of data-reading directions, and the sampling points on a phase encoding line are concentrated in a low frequency region and their number is less than that of full sampling points, and a view angle tilting compensation gradient is superimposed on the axis of the slice-selection gradient, the combining unit 502 combines the k space data acquired in the number of RO directions and converts the same into a final image.

When the acquisition unit 501 acquires the k space data in each of the RO directions, the phase encoding lines are distributed over the whole k space.

When the combining unit 502 acquires the k space data in the RO direction of each data, it combines a parallel acquisition technology or a partial Fourier imaging technology.

The acquisition unit 501 acquires the k space data in the plurality of data-reading directions using a TSE sequence.

The acquisition unit 501 superimposes a compensation gradient on the axis of slice-selection gradient at the same time as applying a readout gradient; preferably, the compensation gradient and the slice-selection gradient are of the same amplitude.

The acquisition unit acquires the k space data in N data RO directions and the rotation incremental angle in all the data RO directions in k space is $\pi/N$.

By using the above-mentioned method and apparatus, image blurring can be avoided while effectively calibrating geometric distortions. At the same, since the solution of the present invention adopts the acquisition mode of rotating the number of blades, the motion appearing during the acquisition of one blade can be corrected by the data acquired from other blades, therefore, the solution of the present invention also has the effects of calibrating motion distortion.

Figure 6:
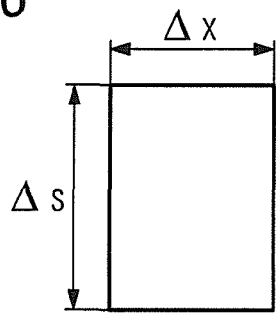
FIG. 6 is a schematic diagram of the pixel shape without adopting the VAT imaging.

FIG. 6 is a schematic diagram of the pixel shape without adopting the VAT imaging. As shown in FIG. 6, the pixel shape without adopting the VAT imaging is a rectangle, where $\Delta s$ is the thickness of a selected slice, $\Delta x = FOV_{RO}|N_{RO}$ is the resolution of the complete readout, and at this time the RO direction is of a full resolution.

Figure 7:
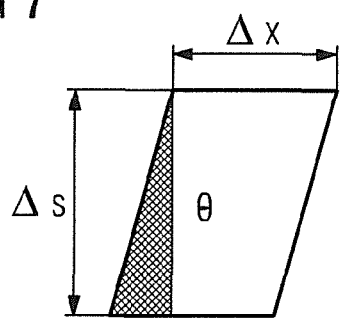
FIG. 7 is a schematic diagram of the pixel shape with the VAT imaging.

FIG. 7 is a schematic diagram of the pixel shape with VAT imaging. As shown in FIG. 7, since during the VAT imaging there is a tilted view angle $\theta$ in the RO direction, a normal rectangular pixel is distorted into a diamond shape, thus leading to image blurring, but there is no distortion in the PE direction. By using the value in the triangle shaped shadow region separated from the whole pixel region, the degree of blurring can be estimated, denoted by a blurring rate (BR). For a conventional VAT calibration:

$$BR = (\Delta s \cdot \tan \theta)/(2 \cdot \Delta x) \qquad (1)$$

wherein $\Delta s$ is the slice thickness, $\Delta x = FOV_{RO}|N_{RO}$ is the resolution of full readout, and $\theta$ is the tilted view angle.

Figure 8:
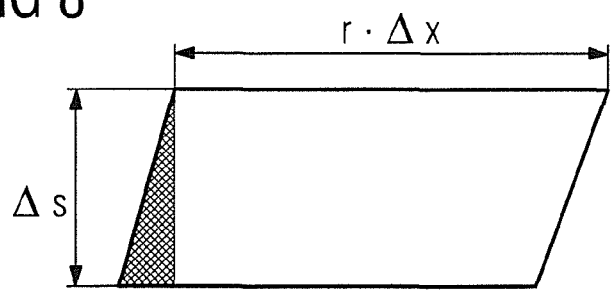
FIG. 8 is a schematic diagram of the pixel shape adopting the solution of the present invention.

FIG. 8 is a schematic diagram of the pixel shape with the adoption of the solution of the present invention. As shown in FIG. 8, since all the blades provide contents of low resolution only in each RO direction, there is no blurring in each PE direction, therefore the BR of the final image can be estimated as:

$$BR \leq (\Delta s \cdot \tan \theta)/(2 \cdot r \cdot \Delta s) \qquad (2)$$

wherein $\Delta s$ is the slice thickness, $\Delta x = FOV_{RO}|N_{RO}$ is the resolution of full readout, $\theta$ is the tilted view angle, and r equals to $N_{RO}|L$.

In addition, as to the solution of the present invention, the blurring extends to all the directions in a final reconstructed image, due to the averaging effect from all the blades, and BR should be only ½ of that of conventional VAT calibration. Therefore, the actual BR may be:

$$BR \leq (\Delta s \cdot \tan \theta)/(2 \cdot r \cdot \Delta s) \qquad (3)$$

wherein $\Delta s$ is the slice thickness, $\Delta x = FOV_{RO}|N_{RO}$ is the resolution of full readout, $\theta$ is the tilted view angle, and r equals to $N_{RO}|L$.

It can be seen from the above comparison that by adopting the solution of the present invention, the degree of blurring of the final image is only $1/(2 \cdot r)$ of that of the final image with conventional VAT calibration. Therefore, by adopting the solution of the present invention the degree of blurring in an image can be considerably reduced.

The advantages of the solution of the present invention will be illustrated by FIGS. 9 to 14.

Figure 9:
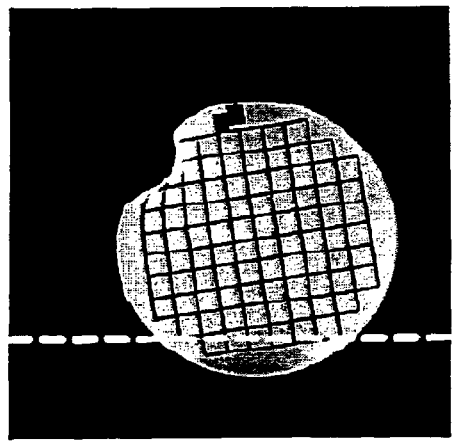
FIG. 9 is an exemplary MR image acquired using standard turbo spin echo (TSE) technology.

FIG. 9 shows an exemplary MR image acquired using standard TSE. As shown in FIG. 9, the image acquired with standard TSE has obvious artifacts due to geometric distortion.

Figure 10:
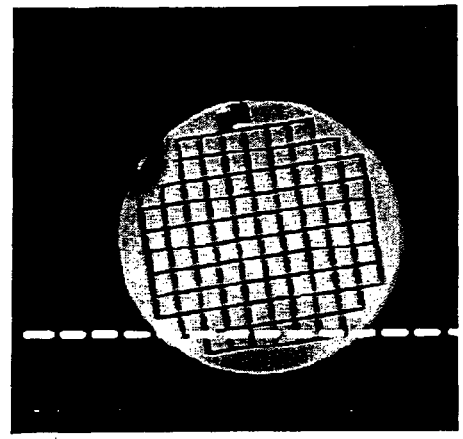
FIG. 10 is an exemplary MR image acquired using the TSE technology combined with VAT.

FIG. 10 shows an exemplary MR image acquired using TSE combined with VAT. As shown in FIG. 10, in the image acquired using TSE combined with VAT, the artifact of geometric distortion is less than that in FIG. 9, but in the image there exists serious blurring.

Figure 11:
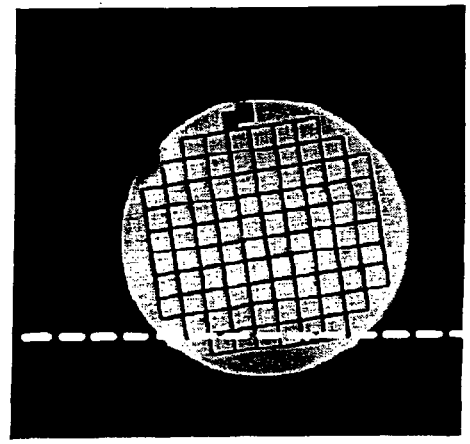
FIG. 11 is an exemplary MR image acquired using the solution of the present invention.

FIG. 11 is an exemplary MR image acquired using the solution of the present invention. As shown in FIG. 11, in the image acquired by the solution of the present invention, the artifact of geometric distortion is less than that in FIG. 10, while the situation of image blurring is significantly improved, and compared with the image in FIG. 9, there is no loss in the signal to noise ratio (SNR).

FIG. 12 is a schematic comparison diagram of the intensity curves of the pixels represented by the dash line in FIGS. 9 to 11. In FIG. 12, the line labeled with squares denotes the intensity curve of the pixels represented by the dashed line in FIG. 9, the line labeled with asterisks denotes the intensity curve of the pixels represented by the dashed line in FIG. 10, the line labeled with triangles denotes the intensity curve of the pixels represented by the dashed line in FIG. 11. As shown in FIG. 12, the intensity curve of the pixels represented by the dash line in FIG. 10 shows that the contrast of pixel intensity is small, the intensity curve of the pixels represented by the dash line in FIG. 11 shows that the contrast of pixel intensity is comparatively large, these contrasts being basically similar to the contrast of pixel intensity of the image in FIG. 9.

FIG. 13 is an MR image with geometric distortion caused by metal false teeth in a patient's mouth. The bright arrow indicates the geometric distortion caused by the metal false teeth, and the dark arrow indicates a pulsing artifact. FIG. 14 is a corrected MR image acquired using the solution of the present invention. As shown in FIG. 14, the geometric distortion indicated by the bright arrow is substantially eliminated and the pulsing artifact indicated by the dark arrow is also reduced. Therefore, by using the solution of the present invention not only can the geometric distortion in the image be reduced and the contour definition of fine tissues maintained, but the pulsation artefact can also be reduced.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for correcting distortion during magnetic resonance imaging, comprising the steps of:
    operating a magnetic resonance data acquisition unit to acquire k space data in a plurality of readout encoding directions, wherein sampling points on a phase encoding line are primarily in a low frequency region of k space and a number of said sampling points on said phase coding line is less than that of all sampling points, and superimposing a view angle tilting compensation gradient on an axis of a slice-selection gradient; and
    in a processor, combining the k space data acquired in the plurality of directions and converting the combined data into data representing a final image, and making said data represent a final image available at an output of said processor.

2. The method as claimed in claim 1, further comprising: sampling all phase encoding lines to obtain full resolution in the phase encoding direction when acquiring the k space data in each of the readout directions.

3. The method as claimed in claim 1, wherein said acquisition of the k space data in each of the readout directions comprises:
    acquiring the k space data in the plurality of readout encoding directions in a parallel acquisition mode or in a partial Fourier imaging mode.

4. The method as claimed in claim 1, wherein said acquisition of the k space data in the plurality of readout encoding directions comprises:
    acquiring the k space data in the plurality of readout directions using a turbo spin echo sequence or a spin echo sequence.

5. The method as claimed in claim 1, wherein said superimposition of the view angle tilting compensation gradient on the axis of the slice-selection gradient comprises:
    superimposing the compensation gradient on the axis of the slice-selection gradient at a same time as a readout gradient is applied.

6. The method as claimed in claim 1, wherein the number of said readout encoding directions is N, in which N is a positive integer; and a rotation incremental angle in all the readout encoding directions in k space is $\pi/N$.

7. The method as claimed in claim 6, wherein a ratio of the number of said sampling points on said phase encoding line to the number of all of said sampling points is an integer, and N is said integer.

8. An apparatus for correcting distortion during magnetic resonance imaging, comprising:
    an acquisition unit that acquires k space data in a plurality of readout encoding directions, wherein sampling points on a phase encoding line are acquired primarily in a low frequency region of k space and a number of said sampling points is less than that of all sampling points, and for superimposing a view angle tilting compensation gradient on an axis of a slice-selection gradient; and
    a combining unit configured to combine the k space data acquired in the plurality of directions and to convert the combined data into a final image.

9. The apparatus as claimed in claim 8, wherein when said acquisition unit acquires the k space data in each of the readout encoding directions, the phase encoding lines are distributed over the whole k space.

10. The apparatus as claimed in claim 8, wherein said combining unit acquires the k space data in each of the readout encoding directions in a parallel acquisition mode or in a partial Fourier mode.

11. The apparatus as claimed in claim 8, wherein said acquisition unit acquires the k space data in the plurality of readout encoding directions using a turbo spin echo sequence or a spin echo sequence.

12. The apparatus as claimed in claim 8, wherein said acquisition unit superimposes the compensation gradient on the axis of the slice-selection gradient at a same time as said acquisition unit causes a readout gradient to be applied.

13. The apparatus as claimed in claim 8, wherein said acquisition unit acquires the k space data in N readout encoding directions, in which N is a positive integer; and the rotation incremental angle in all of the readout directions in k space is $\pi/N$.

* * * * *